(12) United States Patent
Lu et al.

(10) Patent No.: US 6,468,404 B2
(45) Date of Patent: Oct. 22, 2002

(54) APPARATUS AND METHOD FOR REDUCING REDEPOSITION IN A PHYSICAL VAPOR DEPOSITION SYSTEM

(75) Inventors: Jean Qing Lu, Palo Alto, CA (US); Tom Yu, San Leandro, CA (US); Jeffrey Tobin, Mountain View, CA (US)

(73) Assignee: Novellus Systems, Inc., San Jose, CA (US)

( * ) Notice: Subject to any disclaimer, the term of this patent is extended or adjusted under 35 U.S.C. 154(b) by 41 days.

(21) Appl. No.: 09/768,863

(22) Filed: Jan. 23, 2001

(65) Prior Publication Data

US 2002/0096427 A1 Jul. 25, 2002

(51) Int. Cl.⁷ .............................................. C23C 14/35
(52) U.S. Cl. .............................. 204/192.3; 204/298.16; 204/192.12; 204/192.15; 204/192.22
(58) Field of Search ....................... 204/192.12, 192.15, 204/192.22, 192.3, 298.16; 134/1.1

(56) References Cited

U.S. PATENT DOCUMENTS 5,772,858 A * 6/1998 Tepman .................. 204/192.12
6,228,236 B1 * 5/2001 Rosenstein et al. ...... 204/298.2
6,342,133 B2 * 1/2002 D'Couto et al. ....... 204/192.17

* cited by examiner

Primary Examiner—Steven H. VerSteeg
(74) Attorney, Agent, or Firm—Okamoto & Benedicto LLP

(57) ABSTRACT

A PVD system comprises a hollow cathode magnetron with a capability of producing a high magnetic field for PVD and a low magnetic field for pasting. The high magnetic field is used for PVD and causes an optimal uniform film to form on a substrate but redeposits some metals onto a top portion of a target within the magnetron. The low magnetic field erodes redeposited materials from a top portion of a target within the magnetron.

20 Claims, 6 Drawing Sheets

APPARATUS AND METHOD FOR REDUCING REDEPOSITION IN A PHYSICAL VAPOR DEPOSITION SYSTEM

BACKGROUND OF THE INVENTION

1. Field of the Invention

This invention relates generally to Physical Vapor Deposition ("PVD") systems, and more particularly to an apparatus and method for reducing redeposition in a PVD system.

2. Description of the Background Art

Physical vapor deposition ("PVD") is a well known technique for depositing metal layers onto semiconductor wafers (also referred to herein as "substrates"). These thin metal layers can be used as diffusion barriers, adhesion or seed layers, primary conductors, antireflection coatings, etch stops, etc.

In a conventional Hollow Cathode Magnetron ("HCM"), magnetic fields are used to generate a high-density plasma of Argon ("Ar") or other suitable inert gas and target material within a cathode of the HCM. The magnetic fields are also used to confine the plasma within the HCM. The cathode has a target, such as Tantalum ("Ta"), Aluminum ("Al"), Titanium ("Ti"), or other suitable metal. A power pin supplies a negative potential to the target such that the magnetic fields in combination with the negative potential cause plasma ions to hit the target with high energy, thereby causing target atoms to dislodge from the surface of the target by direct momentum transfer and also creating secondary electrons. These dislodged atoms and ions are then deposited on the semiconductor wafer.

However, due to the magnetic fields inside the HCM, plasma ions do not evenly erode the HCM target. Specifically, in a conventional HCM, the sidewalls of the target are usually eroded more than the top of the target. Once the sidewalls of the target are fully eroded, the target must be replaced, even though the top of the target may have a large amount of metal remaining.

Further, during a conventional PVD process using titanium nitride ("TiN") or tantalum nitride ("TaN") in a HCM, a high magnetic field provides an ideal TiN or TaN layer on the substrate but also causes redeposition of TiN or TaN particles onto the target. Redeposition may be caused by in-flight gas scattering, reflection of the depositing atoms at other surfaces, less-than-unity sticking of the depositing atoms, or even resputtering from other surfaces on the target. Because the redeposited particles are of a high stress nature, the particles may settle on the substrate, thereby damaging the substrate.

In order to prevent redeposition of TiN or TaN particles, the magnetic field within the cathode is adjusted to minimize redepositon area on the top of the target during the TiN or TaN process. However, the adjustment of the magnetic field leads to a less than optimal film layer on the substrate.

Therefore, a new system and method are needed that can form a uniform layer on the substrate, while reducing target particle formation and increasing uniform target erosion.

SUMMARY

The present invention relates to an apparatus for forming a uniform film on a substrate in a PVD system, while decreasing particle defects and increasing uniform erosion of the target. In one embodiment, the apparatus comprises a HCM that can operate under dual modes. A first mode produces a high magnetic field in the HCM for producing a uniform film (or deposition layer) on the substrate but may cause uneven target erosion and particle redeposition on the target. A second mode produces a low magnetic field in the HCM for pasting the target, which erodes the top of the target containing the redeposited material, thereby removing the TiN or TaN particles and compensating for the uneven erosion of the target that may have been caused during the high magnetic field mode.

The present invention also provides a method for forming a uniform film on a substrate in a HCM PVD system and pasting a target in the HCM. After injection of Nitrogen and an inert gas, such as Argon, into the HCM, electromagnetic ("EM") coils in the HCM generate a high magnetic field within the cathode of the HCM. The high magnetic field causes Argon plasma ions to strike the target sidewalls, which is made of Ta or Ti or other suitable metal, thereby dislodging target atoms, which then bond with the Nitrogen to form TaN or TiN depending on the target material. The TaN or TiN then deposits on the substrate on a pedestal in the HCM, forming an optimal uniform layer of TaN or TiN. However, some TaN or TiN also redeposits back onto the target. These particles of TaN or TiN can easily deposit on the substrate.

Accordingly, after the EM coils produce the high magnetic field for processing up to 25 wafers at eight seconds per wafer, the Nitrogen is evacuated from the chamber and the EM coils produce a low magnetic field for pasting. During the pasting, the wafer is replaced with a dummy wafer or a protective electrostatic chuck cover ("PEC") wafer is placed on top of the pedestal. The pasting lasts approximately 120 seconds and erodes the top of the target that has the majority of the redeposited TaN or TiN, thereby removing the high stress particles that are most likely to get deposited during the PVD process. In addition, the pasting causes further erosion of the top of target, thereby making the target more uniformly eroded.

Accordingly, the system and method advantageously performs PVD onto a wafer, possibly yielding a uniform film on the wafer, increasing uniformity of target erosion and decreasing particle defects.

DETAILED DESCRIPTION OF THE PREFERRED EMBODIMENT

The following description is provided to enable a person skilled in the art to make and use the invention, and is provided in the context of a particular application and its requirements. Various modifications to the embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
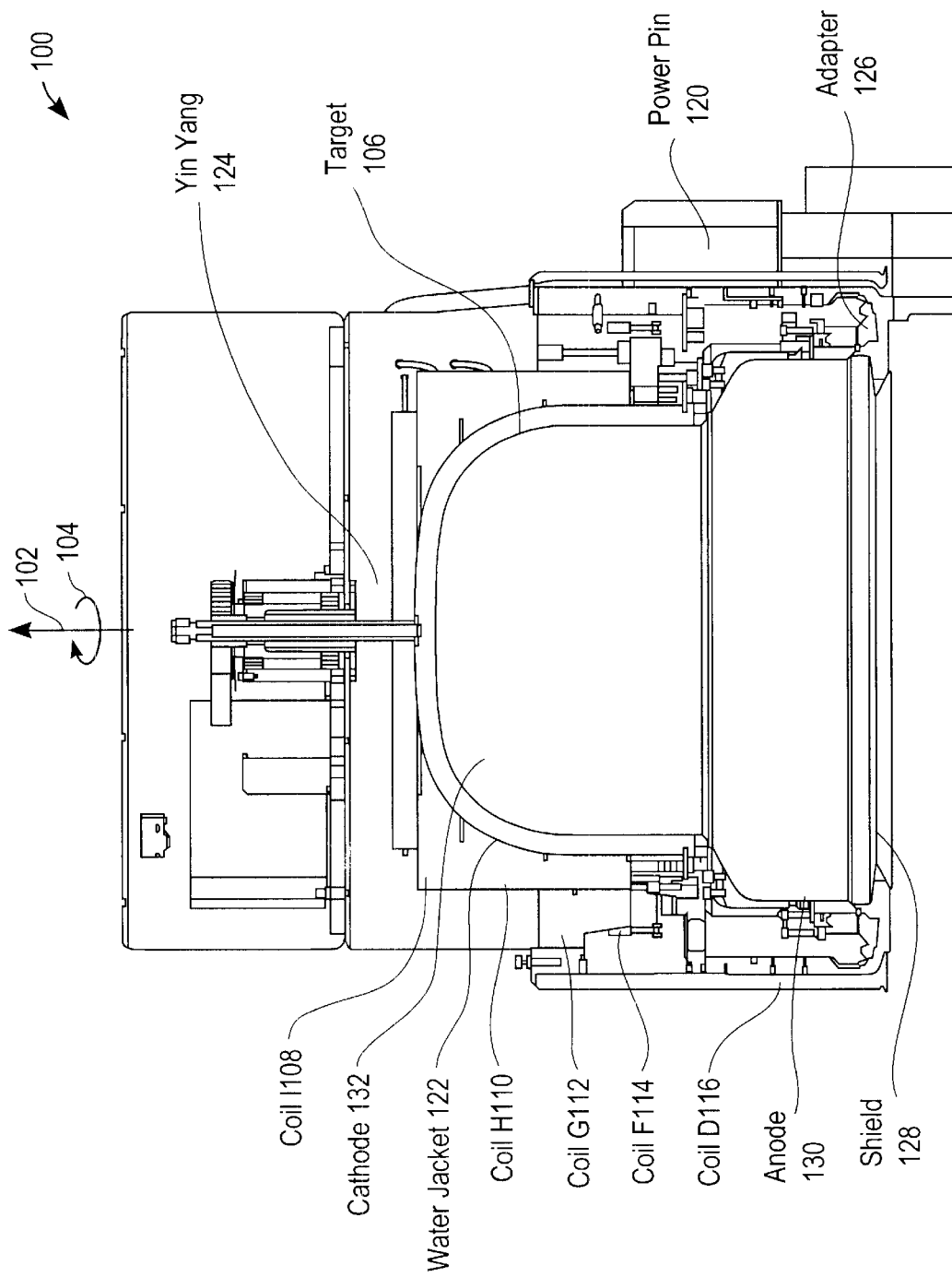
FIG. 1 shows a cutaway view of a HCM source according to an embodiment of the present invention.

FIG. 1 shows a cutaway view of a HCM source 100 according to an embodiment of the present invention. The HCM source 100 is symmetrical in shape around axis 102 as indicated by arrow 104. HCM source 100 has a cathode 132, wherein the plasma is generated, and an electrically floating anode 130 located beneath the mouth of target 106. Target 106 is composed of tantalum ("Ta"), which is biased to about −300 to −400 volts using voltage from power pin 120, which has a source power of 25 kW and current of 71 Amps. In an alternative embodiment of the present invention, the target 106 is composed of titanium or other suitable material. Cathode 132 and target 106 can be of any planar or hollow non-planar shape. Other HCM sources, such as those disclosed in commonly owned U.S. patent application Ser. No. 09/345,466 entitled "Apparatus and Method for Controlling Plasma Uniformity Across a Substrate" filed Jun. 30, 1999, and U.S. patent application Ser. No. 09/653,611 entitled "Apparatus and Method for Controlling Plasma Uniformity Across a Substrate" filed Aug. 31, 2000, may also be used. The just-mentioned applications are incorporated herein by reference in their entirety.

During the high magnetic field mode used for PVD, Argon or another suitable inert gas that cannot react with the target 106 is injected into HCM source 100 by an injector (not shown) at a flow rate of 9 standard cubic centimeters per minute ("sccm"). Nitrogen can also be injected into the HCM source via the same injector or a second injector (not shown). Pressure within the HCM is generally maintained at about 0.5 mTorr. HCM source 100 also comprises coil I 108, coil H 110, coil G 112, and coil F 114, which, in concert, generate a magnetic field that creates a plasma from the Argon gas within the HCM source 100. The plasma created is a high-density plasma on the order of $10^{13}$ cm$^3$. Due to the negative potential of the target 106, ions from the plasma impact the tantalum target 106 causing target atoms to sputter off of the surface of the target 106 due to direct momentum transfer. The target atoms bond with the Nitrogen to form TaN (or TiN if the target is made of Ti). As the TaN molecules travel downstream in the HCM 350 (FIG. 3), plasma downstream control mechanism 300 (FIG. 3) directs the TaN molecules to a wafer or substrate (not shown). However, some TaN molecules travel upstream and strike the target 106, sticking to it. The TaN molecules that strike the target 106 can easily become particles, hitting the wafer and thereby damaging it. In addition, portions of the target, particularly the top, are unevenly eroded by the ion bombardment.

In one embodiment, the coils used to generate and confine the plasma during the high magnetic field mode used in the PVD process have strengths as follows: coil I 108 has a coil strength of 1,576.8 amp-turn; coil H 110 has a coil strength of 1,016.6 amp-turn; coil G 112 has a coil strength of 600.6 amp-turn; and coil F 114 has a coil strength of 415.8 amp-turn. Coil D 116 is part of the plasma downstream control mechanism and has a strength of −552 amp-turn. While the illustrated embodiment of the HCM source 100 has four coils, any number of coils can be used as long as the plasma can be generated and maintained within the cathode 132. These coils I 108, H 110, G 112, and F 114 produce a high magnetic field having a maximum field value of 120 Gauss. However, varying the coil strengths may produce any magnitude high magnetic field. The only limitation of the high magnetic field is that the high magnetic field must be suitable for PVD.

Figure 2B:
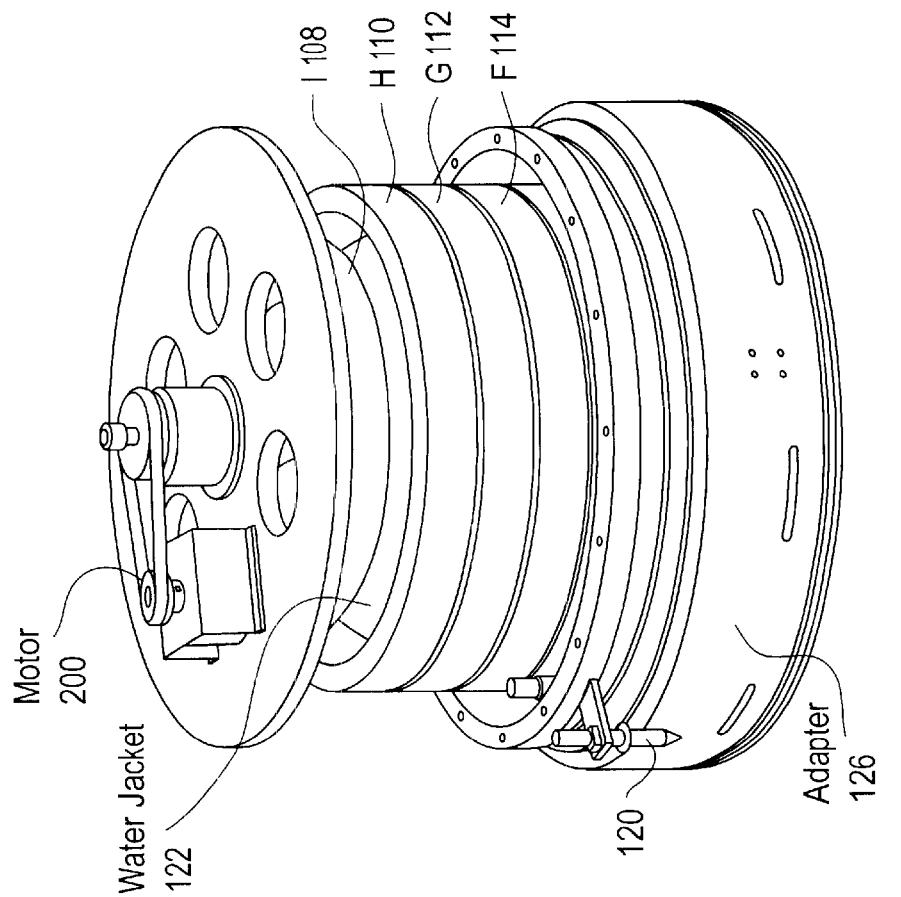
FIG. 2a and FIG. 2b show the exterior of the HCM source of FIG. 1.

Other features of the HCM source 100 include a water jacket 122, which cools the target 106; adapter 126, which supports the HCM source 100; and shield 128, which blocks any magnetic flux leaking out from the HCM source 100, so as to reduce interference between two adjacent HCM sources. HCM source 100 also includes yin yang 124, which is a rotating permanent magnet spun by motor 200 (FIG. 2*b*).

Figure 3:
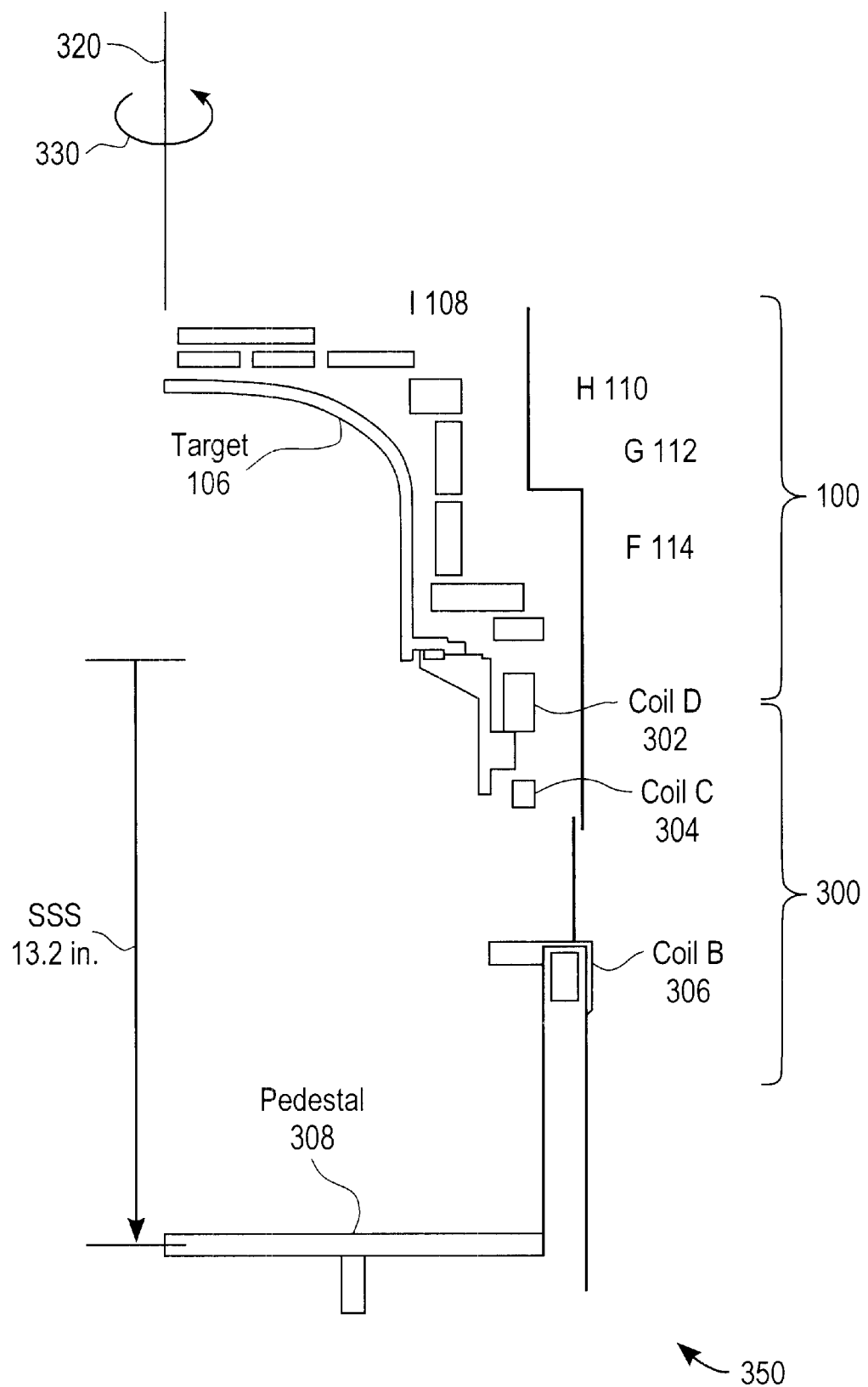
FIG. 3 shows a schematic diagram of a PVD system including the HCM source of FIG. 1 and a plasma downstream control mechanism according to an embodiment of the present invention.

After the PVD process is completed for approximately 25 wafers, a pasting process ensues. First, Nitrogen is evacuated from the HCM source 100. In practice, this entails evacuating all gases from the HCM source 100 (i.e., both Nitrogen and Argon). A dummy wafer is placed on the pedestal 308 (FIG. 3). Alternatively, a PEC can be placed over the pedestal. Argon is then injected into HCM source 100 at a higher rate than in the high magnetic field mode so as to maintain a pressure of about 5–6 mTorr within the HCM source 100.

The magnetic coils I 108; H 110; G 112; and F 114 then produce a low magnetic field. During the low magnetic field mode, coil I 108 has a strength of 394.2 amp-turn; coil H 110 has a strength of 353.6 ampturn; coil G 112 has a strength of 369.6 amp-turn; and coil F 114 has a strength of 369.9 amp-turn. Coil D 116 of the plasma downstream control device has a strength of −276 amp-turn. These coil values produce a low magnetic field having a maximum field strength of 80 Gauss. However, any magnitude magnetic field may be produced by varying the coil strength, as long as the low magnetic field is relatively weaker than the high magnetic field.

The pasting process lasts, approximately 120 seconds and the low magnetic field of the pasting process causes plasma ions to strike the top of target 106, thereby eroding the portion of the target having the majority of the redeposited material. The plasma ions dislodge the redeposited molecules (TiN or TaN), which then deposits on the dummy wafer or PEC. After completion of the pasting process, the target 106 is substantially free of redeposited material that might create articles and damage a substrate during the next PVD process. Further, because the pasting process causes erosion of the top of the target 106, the target 106 has a more uniform erosion profile than if the PVD process using the high magnetic field alone was run.

Figure 2A:
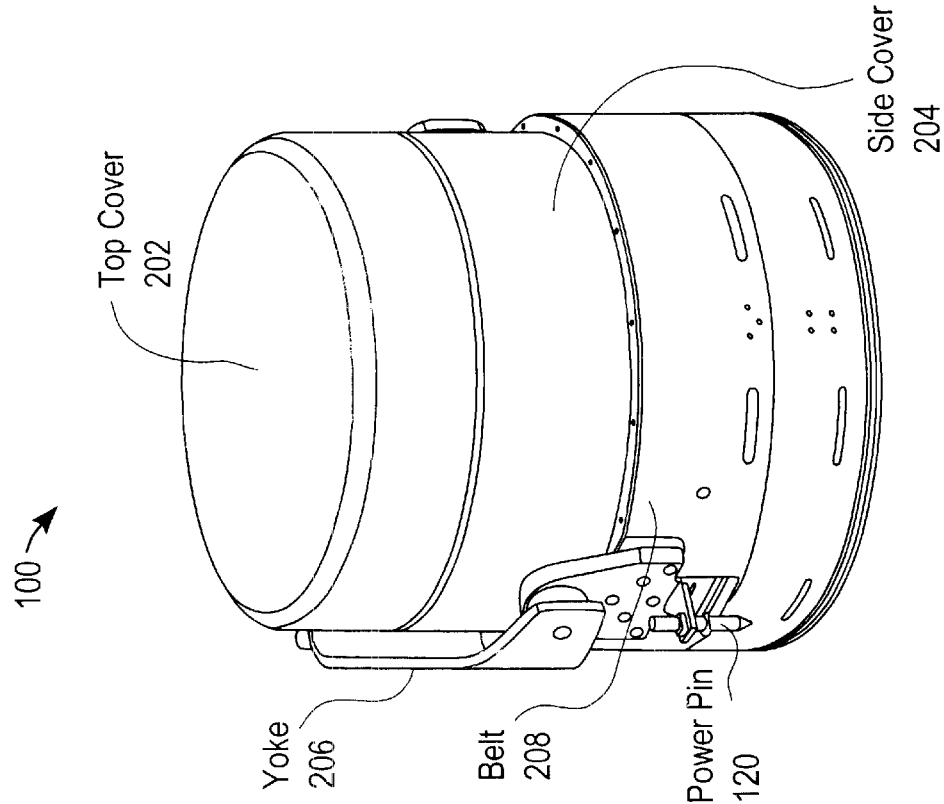

FIG. 2*a* shows the exterior of HCM source 100, which includes top cover 202; side cover 204; yoke 206; and belt 208. Also shown is the power pin 120 of FIG. 1. Top cover 202, side cover 204, and belt 208 can be removed to allow access to the coils I 108, H 110, G 112, and F 114 as well as the target 106.

FIG. 2*b* shows the exterior of HCM source 100 with the top cover 202, side cover 204, and belt 208 removed. Visible in FIG. 2*b* are coils I 108, H 110, G 112, and F 114; water jacket 122; and adapter 126. Also shown is motor 200, which spins yin yang 124 (FIG. 1).

FIG. 3 shows a schematic diagram of a PVD system including the HCM source 100 and a plasma downstream control mechanism 300 according to an embodiment of the present invention. The HCM source 100 and plasma downstream control mechanism 300 are symmetrical about axis 320 as indicated by arrow 330. As shown in FIG. 3, plasma downstream control mechanism 300 includes a coil D 302, a coil C 304, and a coil B 306. As discussed in FIG. 1, this view of HCM source 100 includes target 106, and EM coils H 110, G 112, F 114, and I 108. HCM 350 also comprises pedestal 308 on which the substrate or wafer is placed for PVD during the high magnetic field mode. During the low magnetic field mode, a dummy wafer is placed on the pedestal 308. Alternatively, a PEC may be placed on top of the pedestal 308 during pasting.

Figure 4:
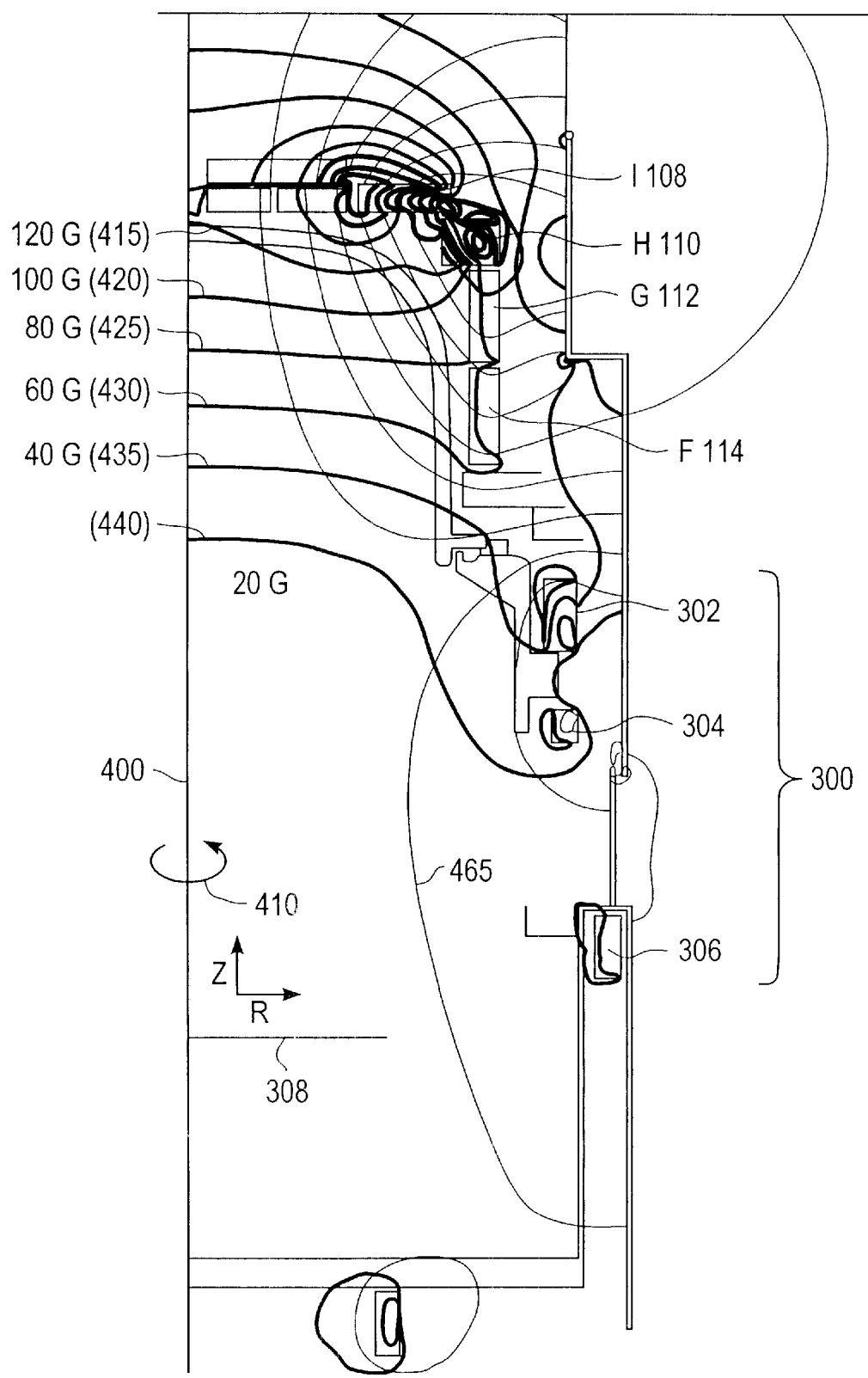
FIG. 4 shows a magnetostatic simulation plot for the PVD system of FIG. 3 during the high magnetic field mode.

FIG. 4 shows a magnetostatic simulation plot for the HCM 350 during the high magnetic field mode. The HCM source 100 and plasma downstream control mechanism 300 are symmetrical about axis 400 as indicated by arrow 410. The high magnetic field mode has a maximum field strength of approximately 120 Gauss. Alternatively, the high magnetic field mode may have any maximum field strength that is suitable for a conventional PVD process.

Coils I 108, H 110, G 112, and F 114 are used to generate magnetic field lines 415, 420, 425, 430, 435, and 440. The strength of the field lines 415, 420, 425, 430, 435, and 440 are as indicated in FIG. 4 but can be varied by modifying the current flow in the coils I 108, H 110, G 112, and F 114. Magnetic field lines 415, 420, 425, 430, 435, and 440 are aligned in the radial or R direction and are used to generate a plasma from the injected inert gas.

Magnetic field lines 415, 420, 425, 430, 435, and 440 cause ions from the plasma to impact the sidewalls of the target 106. Upon impact, the plasma ions cause target atoms to dislodge from the target 106 due to direct momentum transfer. A percentage of the target atoms bond with Nitrogen to form TiN or TaN molecules, depending on the target material. A majority of the molecules are then deposited onto the wafer on pedestal 308, thereby forming an optimal uniform film. However, a portion of the newly formed TiN or TaN molecules redeposit back onto the top of the target. These molecules can easily become particles and damage the wafer during the PVD process.

Figure 5:
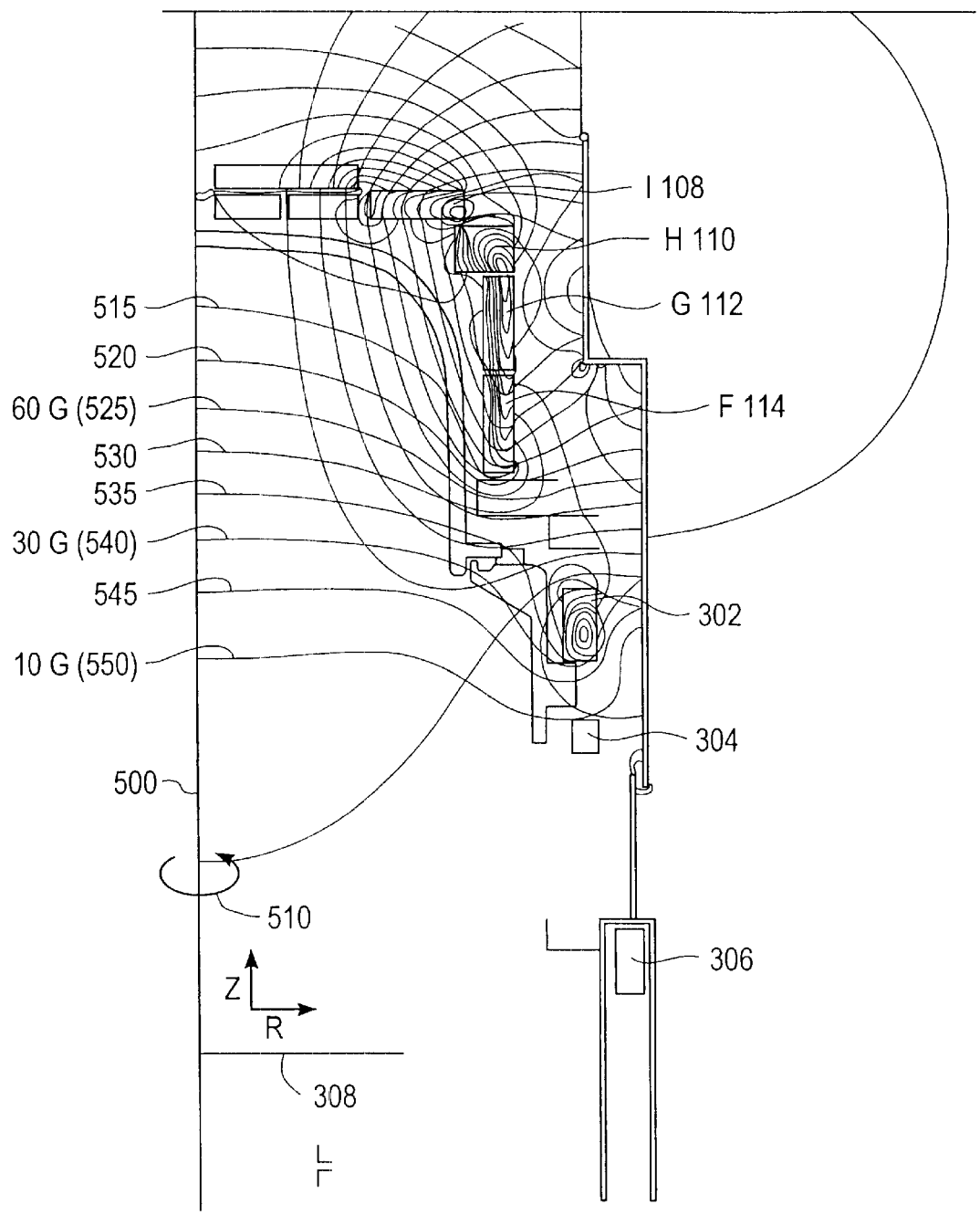
FIG. 5 shows a magnetostatic simulation plot for the PVD system of FIG. 3 during the low magnetic field mode.

FIG. 5 shows a magnetostatic simulation plot for the HCM 350 (FIG. 3) during the low magnetic field mode. The low magnetic field has a maximum field strength of approximately 80 Gauss. However, the low magnetic field may have any maximum field strength as long as the field strength is less than the high magnetic field strength. The HCM source 100 and plasma downstream control mechanism 300 are symmetrical about axis 500 as indicated by arrow 510. Coils I 108, H 110, G 112, and F 114 are used to generate magnetic field lines 515, 520, 525, 530, 535, 540, 545, 550, and separatrix 555. The strength of the field lines 515, 520, 525, 530, 535, 540, 545, and 550 are as indicated in FIG. 5 but can be varied by modifying the current flow in the coils I 108, H 110, G 112, and F 114. Magnetic field lines 515, 520, 525, 530, 535, 540, 545, 550, and separatrix 555 are aligned in the radial or R direction and are used to generate a plasma from the injected inert gas.

Magnetic field lines 515, 520, 525, 530, 535, 540, 545, 550, and separatrix 555 cause ions from the plasma to impact the top of the target 106. Upon impact, the plasma ions cause target material to dislodge from the target 106 due to direct momentum transfer. As there may be a significant amount of redeposited TiN or TaN from the PVD process, the ion impact on the target 106 dislodges a high percentage of the redeposited TiN or TaN, thereby preventing the redeposited molecules to create particles in a next PVD process (high magnetic field mode). Further, as the top of the target 106 is usually not eroded during the PVD process, the ion bombardment of the top of target 106 during the low magnetic field mode evens out the erosion profile of the target 106.

Figure 6:
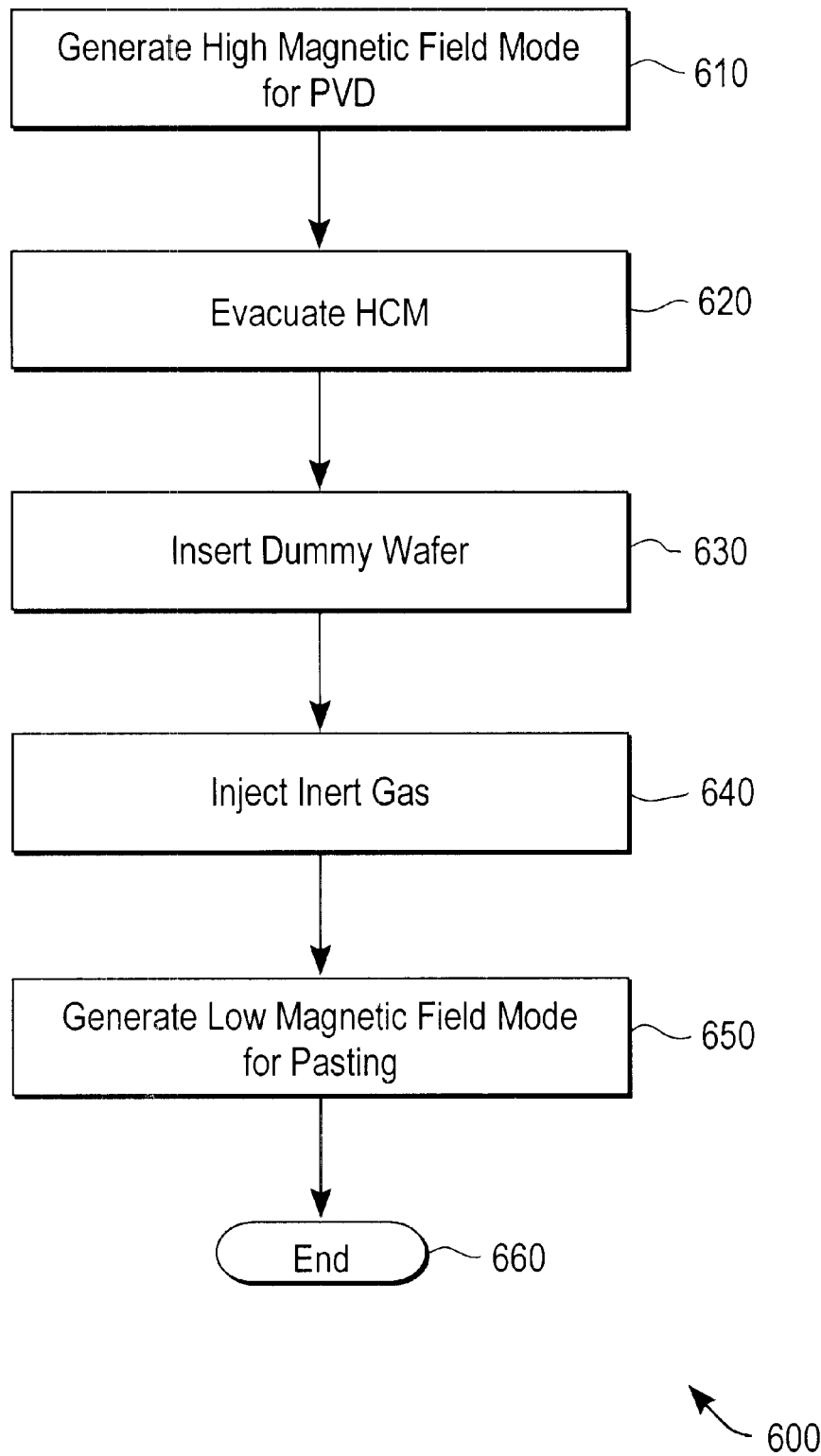
FIG. 6 shows a flowchart of method steps for a PVD process according to an embodiment of the invention.

FIG. 6 is a flowchart of method steps 600 for a PVD process according to an embodiment of the invention. At step 610, coils I 308, H is 110, G 112, and F 114, operating under a high magnetic field mode, generate a high magnetic field having a maximum field strength of approximately 120 Gauss for performing a conventional PVD TiN or TaN process. During the PVD process, plasma ions bombard the sidewalls of target 106, thereby dislodging target atoms by direct momentum transfer. The dislodged target atoms bond with the injected Nitrogen to form TaN or TiN (depending on the target material used), which then deposits on the substrate generating an optimal uniform film on the substrate. However, some of the TaN or TiN redeposits on the top of the target 106, which can create particles and damage a substrate during the PVD process. After approximately 25 wafers are processed at a rate of about eight seconds per wafer, the risk of high particle adders in the system and damaging a wafer becomes unacceptable and the method 600 proceeds to step 620.

After 25 wafers are processed, the HCM 350, at step 620, is evacuated of all gases (i.e., inert gas (usually Argon) and Nitrogen (or other gas)). At step 630, the most recently processed wafer is removed and a dummy wafer is inserted on to pedestal 308. In an alternative embodiment, instead of replacing the processed wafer with a dummy wafer, a PEC may be inserted on pedestal 308.

At step 640, an inert gas, such as Argon, is injected into HCM 350. At step 650, the coils I 308, H 110, G 112, and F 114, operating under a low magnetic field mode having a maximum field strength of approximately 80 Gauss, generate a low magnetic field for pasting. The coils I 308, H 110, G 112, and F 114 generate a high density plasma from the injected inert gas. Plasma ions then strike the top of the target 106, dislodging redeposited material formed during the PVD process of step 610. The dislodged material then deposits on the dummy wafer on pedestal 308. Further, since the low magnetic field mode causes erosion of the top of target 106, the erosion profile of target 106 is made more uniform to match the erosion profile of the target 106 sidewalls during the PVD process of step 610.

At step 660, the method ends and the HCM 350 can be used again for another set of PVD processes.

The foregoing description of the preferred embodiment of the present invention is by way of example only, and other variations and modifications of the above-described embodiments and methods are possible in light of the foregoing teaching. For example, the PVD process may use any target material and gas combination. Further, the number, type and shape of components or magnetic materials shown can be varied to achieve the same effect as that disclosed herein. The present invention is limited only by the following claims.

What is claimed is:

1. A method, comprising:
    performing, in a physical vapor deposition system, a physical vapor deposition process on a substrate using a first magnetic field having a first maximum magnetic field strength suitable for physical vapor deposition;
    evacuating the physical vapor deposition system of gas and plasma;
    replacing the substrate with a dummy wafer;
    generating a plasma in the physical vapor deposition system using a second magnetic field so as to remove redeposited target material/gas molecules from a target in the physical vapor deposition system, the second magnetic field having a second maximum magnetic field strength less than the first maximum magnetic field strength.

2. The method of claim 1, wherein the gas is Nitrogen.

3. The method of claim 1, wherein the second magnetic field is maintained for about 2 minutes.

4. The method of claim 1, wherein the target comprises Titanium.

5. The method of claim 1, wherein the target comprises Tantalum.

6. The method of claim 1, wherein the first maximum magnetic field strength is about 120 Gauss.

7. The method of claim 1, wherein the second maximum magnetic field strength is about 80 Gauss.

8. An apparatus comprising:

performing means for performing a physical vapor deposition process on a substrate using a first magnetic field having a first maximum magnetic field strength suitable for physical vapor deposition;

evacuating means for evacuating the performing means of gas and plasma;

replacing means for replacing the substrate with a dummy wafer;

generating means for generating a plasma in the performing means using a second magnetic field so as to remove redeposited target material/gas molecules from a target in the performing means, the second magnetic field having a second maximum magnetic field strength less than the first maximum magnetic field strength.

9. A method, comprising:

performing, in a physical vapor deposition system, a physical vapor deposition process on a substrate using a first magnetic field having a first maximum magnetic field strength suitable for physical vapor deposition;

evacuating the physical vapor deposition system of gas and plasma;

covering the substrate with a protective electrostatic chuck cover;

generating a plasma in the physical vapor deposition system using a second magnetic field so as to remove redeposited target material/gas molecules from a target in the physical vapor deposition system, the second magnetic field having a second maximum magnetic field strength less than the first maximum magnetic field strength.

10. The method of claim 9, wherein the gas is Nitrogen.

11. The method of claim 9, wherein the second magnetic field is maintained for about 2 minutes.

12. The method of claim 9, wherein the target comprises Titanium.

13. The method of claim 9, wherein the target comprises Tantalum.

14. The method of claim 9, wherein the first maximum magnetic field strength is about 120 Gauss.

15. The method of claim 9, wherein the second maximum magnetic field strength is about 80 Gauss.

16. An apparatus comprising:

performing means for performing a physical vapor deposition process on a substrate using a first magnetic field having a first maximum magnetic field strength suitable for physical vapor deposition;

evacuating means for evacuating the performing means of gas and plasma;

covering means for covering the substrate with a protective electrostatic chuck cover;

generating means for generating a plasma in the performing means using a second magnetic field so as to remove redeposited target material/gas molecules from a target in the performing means, the second magnetic field having a second maximum magnetic field strength less than the first maximum magnetic field strength.

17. A method comprising:

generating a first magnetic field in a physical vapor deposition system to perform a physical vapor deposition process on a substrate, the first magnetic field having a first maximum magnetic field strength;

protecting the substrate from further processing; and generating a second magnetic field to remove redeposited material from a target in the physical vapor deposition system, the second magnetic field having a second maximum magnetic field strength that is less than the first magnetic field strength.

18. The method of claim 17 wherein protecting the substrate from further processing comprises replacing the substrate with a dummy wafer.

19. The method of claim 17 wherein protecting the substrate from further processing comprises covering the substrate.

20. The method of claim 17 wherein protecting the substrate from further processing comprises removing the substrate from the physical vapor deposition system.

* * * * *